United States Patent
Fu et al.

(10) Patent No.: US 11,994,986 B2
(45) Date of Patent: May 28, 2024

(54) VALID DATA RETRIEVAL FOR GARBAGE COLLECTION

(71) Applicant: InnoGrit Technologies Co., Ltd., Shanghai (CN)

(72) Inventors: Bo Fu, Cupertino, CA (US); Jie Chen, Milpitas, CA (US)

(73) Assignee: InnoGrit Technologies Co., Ltd., Shanghai (CN)

( * ) Notice: Subject to any disclaimer, the term of this patent is extended or adjusted under 35 U.S.C. 154(b) by 71 days.

(21) Appl. No.: 17/944,443

(22) Filed: Sep. 14, 2022

(65) Prior Publication Data

US 2024/0086317 A1  Mar. 14, 2024

(51) Int. Cl.
*G06F 12/02* (2006.01)
*G06F 12/0882* (2016.01)
*G11C 16/16* (2006.01)

(52) U.S. Cl.
CPC ...... *G06F 12/0253* (2013.01); *G06F 12/0246* (2013.01); *G06F 12/0882* (2013.01); *G06F 2212/1032* (2013.01); *G06F 2212/1044* (2013.01); *G06F 2212/2022* (2013.01); *G11C 16/16* (2013.01)

(58) Field of Classification Search
CPC ............. G06F 12/0253; G06F 12/0246; G06F 12/0882; G06F 2212/1032; G06F 2212/1044; G06F 2212/2022
See application file for complete search history.

(56) References Cited

U.S. PATENT DOCUMENTS

| | | | |
|---|---|---|---|
| 6,543,016 B1* | 4/2003 | Lewandowski | G11C 29/02 711/108 |
| 2015/0213897 A1* | 7/2015 | Lin | G11C 16/16 365/185.29 |
| 2018/0012655 A1* | 1/2018 | Senoo | G11C 13/0069 |

* cited by examiner

*Primary Examiner* — Tasnima Matin
(74) *Attorney, Agent, or Firm* — IPro, PLLC

(57) ABSTRACT

Systems and methods are provided for data retrieval in garbage collection (GC) processes. A method may include sending a command with bitmaps from a processor to a non-volatile storage device interface controller to perform a read operation on multiple blocks across multiple planes. The bitmaps may indicate positions of valid data units in respective pages within the blocks. The method may further include issuing an initial batch of multi-plane read commands to read a page of data from each of the plurality of planes into cache registers, obtaining specified column addresses to selectively identify valid data units for transferring based on the bitmaps and a data unit size, issuing subsequent batches of multi-plane cache read commands followed by data transfer commands, and issuing a cache read end command followed by a last set of data transfer commands. The data transfer commands may include the specified column addresses.

20 Claims, 3 Drawing Sheets

VALID DATA RETRIEVAL FOR GARBAGE COLLECTION

TECHNICAL FIELD

This disclosure relates to the non-volatile memory device management, particularly relates to data retrieval for garbage collection of non-volatile memory devices.

BACKGROUND

The evolution of the modern computing system is driven in-part by the emergence of the Solid State Drives (SSDs) that have demonstrated higher performance of speed and latency over the traditional hard drives. Unlike hard drives that depend on magnetism to store data, SSDs use non-volatile memory devices to perform data storage. The non-volatile memory devices are a family of integrated circuits that are manufactured by advanced process and assembly technologies to achieve multiple levels of vertical stacking of storages units into a small footprint of package for high capacity of storage.

In an SSD, host data will be written ("programmed" in SSD terminology) to an empty page every time. In order to avoid running out of free pages, the SSD controller has to recycle used pages at some point. In this process, the SSD controller picks a used block and copies all valid data units from this block and writes them to empty pages of a different block. The memory cells in the used block will be erased once all valid data units of this block are successfully retrieved and written to the other block. The newly erased block will be used for new data programming. This process to recycle data storage blocks is called garbage collection (GC). GC induces a lot of data movement (e.g., read and write valid data units), which can significantly affect the sustainable program performance of SSDs.

The overhead of GC mainly comprises read and write time of valid data units and block erase time. When the number of valid data units are large, the major overhead will be the read time and write time of valid data units. Because GC can use the most efficient flash program method (e.g., multi-plane cache program), how to find the most efficient approach to read valid data units for GC becomes interesting and important. Therefore, there is a need in the art to develop a more efficient and easier to implement technique to read valid data units for GC.

SUMMARY

The disclosed subject matter relates to systems, methods, and devices that provide data retrieval for garbage collection processes. In an exemplary embodiment, there is provided a method that may comprise sending a command from a processor to a non-volatile storage device interface controller to perform a read operation on a non-volatile storage device for a garbage collection (GC) process on a plurality of blocks of a Logic Unit (LUN) of the non-volatile storage device. The command may be transmitted with bitmaps indicating positions of valid data units in respective pages within the plurality of blocks and the plurality of blocks may be distributed across a plurality of planes of the non-volatile storage device. The method may further comprise issuing an initial batch of multi-plane read commands to the non-volatile storage device, obtaining specified column addresses to selectively identify valid data units for transferring based on the bitmaps and a data unit size for data transfer commands, issuing subsequent batches of multi-plane cache read commands followed by the data transfer commands to the non-volatile storage device, and issuing a cache read end command followed by a last set of data transfer commands to the non-volatile storage device. The initial batch of multi-plane read commands may request the non-volatile storage device read a page of data from each of the plurality of planes into cache registers of the non-volatile storage device. The data transfer commands may include the specified column addresses to selectively identify valid data units of the page of data in the cache registers for transferring from the non-volatile storage device. And the last set of data transfer commands may include a last set of specified column addresses to selectively identify valid data units of a last page of data in the cache registers for transferring.

In another exemplary embodiment, there is provided a non-volatile storage system. The non-volatile storage system may comprise a storage controller including a processor and a non-volatile storage interface controller, and a non-volatile storage device coupled to the storage controller. The processor may be configured to send a command to the non-volatile storage device interface controller to perform a read operation on the non-volatile storage device for a garbage collection (GC) process on a plurality of blocks. The command may be transmitted with bitmaps indicating positions of valid data units in respective pages within the plurality of blocks. The plurality of blocks may be distributed across a plurality of planes of the non-volatile storage device. The non-volatile storage interface controller may be configured to: issue an initial batch of multi-plane read commands to the non-volatile storage device, obtain specified column addresses to selectively identify valid data units for transferring based on the bitmaps and a data unit size for data transfer commands, issue subsequent batches of multi-plane cache read commands followed by the data transfer commands to the non-volatile storage device, and issue a cache read end command followed by a last set of data transfer commands to the non-volatile storage device. The initial batch of multi-plane read commands may request the non-volatile storage device read a page of data from each of the plurality of planes into cache registers of the non-volatile storage device. The data transfer commands may include the specified column addresses to selectively identify valid data units of the page of data in the cache registers for transferring from the non-volatile storage device. The last set of data transfer commands may include a last set of specified column addresses to selectively identify valid data units of a last page of data in the cache registers for transferring.

DETAILED DESCRIPTION

Figure 1:
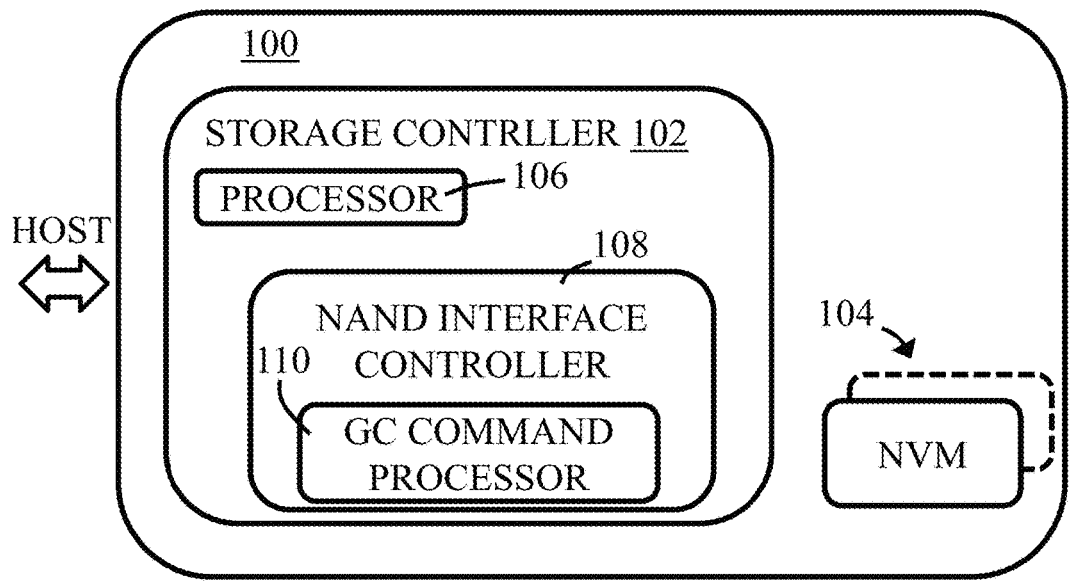
FIG. 1 schematically shows a non-volatile storage system in accordance with an embodiment of the present disclosure.

Specific embodiments according to the present disclosure will now be described in detail with reference to the accompanying figures. Like elements in the various figures are denoted by like reference numerals for consistency.

The present disclosure provides systems and methods for performing valid data units retrieval for garbage collection of non-volatile memory device based storage systems. As used herein, a non-volatile memory device may be a computer storage device that can maintain stored information after being powered off, and the stored information may be retrieved after being power cycled (turned off and back on). Non-volatile storage devices may include floppy disks, hard drives, magnetic tapes, optical discs, NAND flash memories, NOR flash memories, magnetoresistive random Access Memory (MRAM), resistive random access memory (RRAM), phase change random access memory (PCRAM), Nano-RAM, etc. In the description, a NAND flash memory may be used as an example of a non-volatile memory device to demonstrate valid data units retrieval techniques. However, various embodiments according to the present disclosure may implement the techniques with other types of non-volatile storage devices.

FIG. 1 schematically shows an exemplary non-volatile storage system 100 according to an embodiment. The non-volatile storage system 100 may receive commands from a host, for example, to store data to the non-volatile storage system 100 (e.g., a write command) or to read data stored in the non-volatile storage system 100 (e.g., a read command). The non-volatile storage system 100 may comprise a storage controller 102 and a plurality of non-volatile memory (NAND NVM) devices 104. The storage controller 102 may comprise a processor 106 and a NAND interface controller 108.

Each of the NAND devices 104 may be a NAND flash memory chip (or "package"). Each package may contain one or more dies. Each die may be accessed by asserting the chip enable pin. Each die may contain one or more Logic Units (LUNs). The LUN is the smallest unit that can independently execute commands or report status. In embodiments according to the present disclosure, each LUN may contain multiple planes. The planes can execute identical operations concurrently, including cache read operations. Each plane contains a number of blocks, which are the smallest unit to be erased. Each block contains a number of pages, which is composed of multiple cells. Reading and writing data occur at the page level.

The storage controller 102 may be configured to perform garbage collection (GC) operations on the NAND devices 104. Because GC involves copying valid data from blocks of NAND devices 104 before the blocks are erased, the storage controller 102 may be configured to identify blocks to be erased (for GC) and use read operations to efficiently retrieve valid data units from these identified blocks. In one embodiment, the storage controller 102 may generate bitmaps for valid data units in the blocks to be erased. For example, the storage controller 102 may obtain information that indicates which data units in a block contain valid data (referred to as valid data units), and which data units in a block have been marked as "bad" (no valid data).

Figure 2:
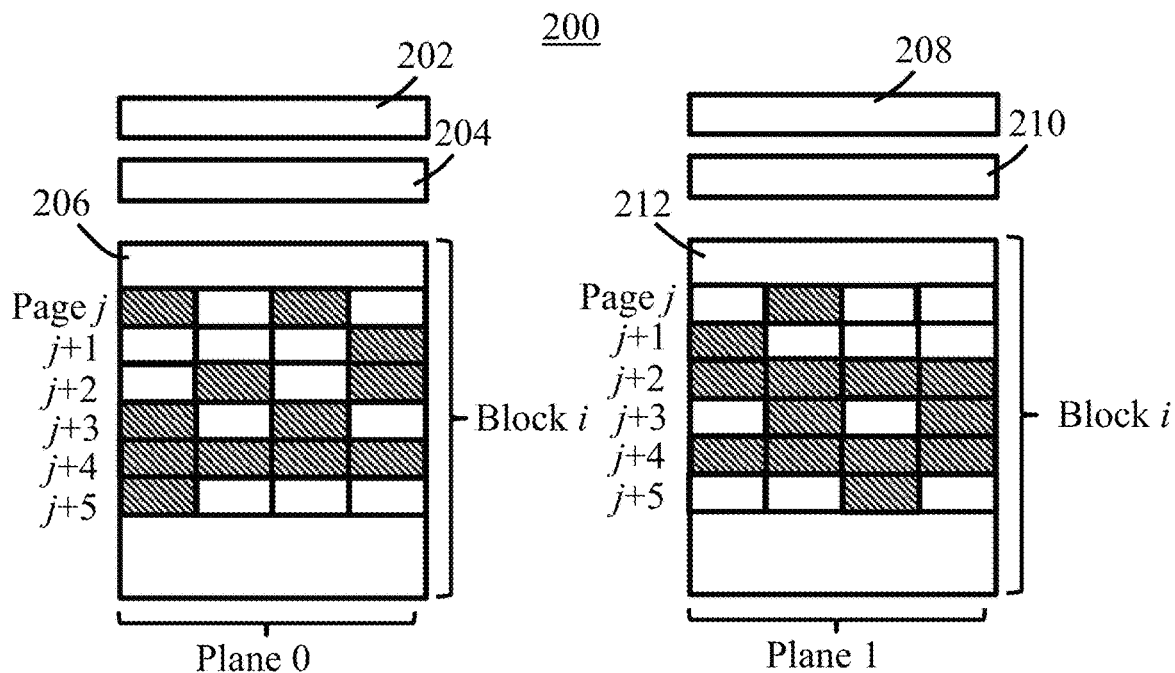
FIG. 2 schematically shows a plurality of planes in a non-volatile memory device in accordance with an embodiment of the present disclosure.

FIG. 2 schematically shows a plurality of planes (Plane 0 and Plane 1) in a Logic Unit (LUN) 200 of a non-volatile memory device in accordance with an embodiment of the present disclosure. The LUN 200 may comprise a cache register 202, a data register 204 and a storage array 206 that contains a plurality of storage cells for Plane 0. The LUN 200 may also comprise a cache register 208, a data register 210 and a storage array 212 that contains a plurality of storage cells for Plane 1. Each plane may contain a plurality of blocks. Each block may contain a plurality of pages and each page may contain a plurality of data units. For illustration purpose, only one block (Block i) in Plane 0 and one block (Block i) in Plane 1, and only pages j through j+5 of Block i in Plane 0 and Plane 1 are illustrated. During read operations, data may be read from the storage array into the data registers 204 and 210, and then transferred to the cache registers 202 and 208. This process may be referred to as reading data from the storage array into the cache registers. It should be noted that both reading data into the data registers and transferring data out of the cache registers take much longer time than transferring data from data registers to the cache registers. Therefore, while data in the cache registers 202 and 208 may be transferred out of the NAND device, a next read operation to read data from the storage array into the data registers 204 and 210 may be performed concurrently.

In FIG. 2, a data unit storing valid data may be represented as a shaded rectangular box, and a data unit that does not storage valid data may be represented in an empty (or white) box. That is, a shaded rectangular box is a valid data unit. As shown in FIG. 2, page j of Block i in Plane 0 may contain two valid data units at positions 1 and 3, page j of Block i in Plane 1 may contain one valid data unit at position 2; page j+1 of Block i in Plane 0 may contain one valid data unit at position 4, page j+1 of Block i in Plane 1 may contain one valid data unit at position 1; and so on and so forth. It should be noted that as shown in FIG. 2, positions of the valid data units may have different patterns in different planes.

Referring back to FIG. 1, the storage controller 102 may be configured to use multi-plane cache read with selective data unit transferring for GC data retrieval. In general, retrieving data from NVM devices may include two phases, a command phase and a data transfer phase. The command phases are used for specifying page addresses for pages of data to be read from a storage array and the data transfer phases are used for transferring data from the NAND devices via NAND Input/Output (IO). In contrast, the read operations based on multi-plane cache read comments may have three phases.

Figure 3:
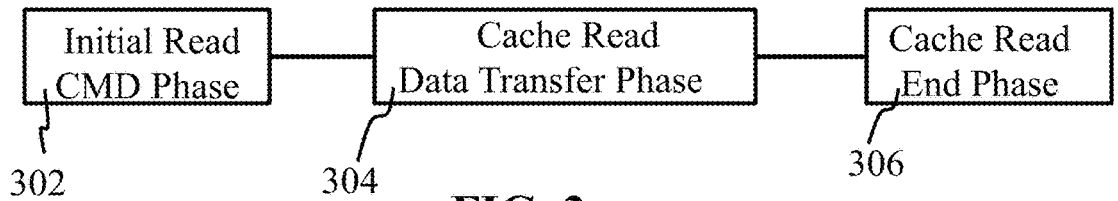
FIG. 3 schematically shows different phases in a read operation in accordance with an embodiment of the present disclosure.

FIG. 3 schematically shows different phases in a read operation in accordance with an embodiment of the present disclosure. In the Initial Read Command Phase 302, an initial batch of multi-plane read commands may be issued for each plane to read a page of data from the plane's storage array into that plane's cache register (e.g., first read to data register and then send to cache register when the cache register becomes available). As used herein, a batch of multi-plane cache read commands may refer to a plurality of multi-plane cache read commands sent to a plurality of planes in the operation, with each multi-plane cache read command in a batch being directed to a different page or address in the plurality of planes.

In the Cache Read Data Transfer Phase 304, subsequent batches of multi-plane cache read commands may be issued with each batch followed by a respective set of data transfer commands. The data transfer commands may include specified column addresses to selectively identify valid data units of the page of data in the cache registers for transferring from the planes. That is, based on the bitmaps, only data units containing valid data units may be selected to be transferred out of the NAND device and other data units may be skipped for transferring. The data transfer commands may be issued when the Ready/Busy (R/B) signal line shows data is ready in the cache registers.

In the Cache Read End phase 306, a cache read end command may be issued and followed by a last set of data transfer commands. The last set of data transfer commands may include a last set of specified column addresses to selectively identify valid data units of a last page of data in the cache registers for transferring.

In one embodiment, when a GC process is performed on a multi-plane NAND device, if one page of any plane has at least one valid data unit, a batch of multi-plane cache read commands may be issued using this page address, even if the same pages in other planes do not have valid data units.

The batch of multi-plane cache read commands may achieve a very high read throughput to read data from storage cells to cache registers. In the Cache Read Data Transfer Phase 304, one or more data transfer command with specified column addresses may be issued so that only interested or valid data units may be transferred out of cache registers of the multi-plane NAND device. Because no invalid data is transferred to NAND Input/Output (10), the data transfer process will not clog the NAND IO and may reduce interference on the read or write operations of other NAND devices. As used herein, a read operation may refer to the overall operation of GC data retrieval of one set of corresponding blocks distributed in multiple planes (e.g., Block i in Plane 0 and Block i in Plane 1 of FIG. 2). Because there may be multiple pages in a block, a read operation may include multiple batches of multi-plane cache read commands and data transfer commands.

Referring back to FIG. 1, the processor 106 may be a microcontroller unit (MCU) configured to execute executable instructions (e.g., software or firmware). In various embodiments, the processor 106 may be a microprocessor, a microcontroller, a field-programmable gate array (FPGA), or an application-specific IC (ASIC).

In some embodiments, all multi-plane cache read commands and data transfer commands for GC may be issued by the processor 106 to the NAND interface controller 108, and the NAND interface controller 108 may generate electrical signals for these commands. If all GC multi-plane cache read commands and data transfer commands are issued by the processor 106 to the NAND interface controller 108, the number of commands issued from the processor 106 may be too many, which adds extra burden on the processor 106 and may impact the overall system performance. Therefore, in at least some embodiments, the NAND interface controller 108 may comprise a GC command processor 110. In the embodiments with the GC command processor 110, the processor 106 may issue a GC multi-plane cache read command without splitting the command phase and data transfer phase to the NAND interface controller 108. In addition, the processor 106 may generate bitmaps indicating positions of valid data units in respective pages within the plurality of blocks (e.g., each bitmap showing positions of valid data units in a respective page of Block i of Plane 0 or Plane 1) and send the bitmaps to the NAND interface controller 108 along with the GC multi-plane cache read command. The bitmaps may be used to indicate which DU is to be retrieved from the NAND device and which DU is to be skipped during data transfer.

In some embodiments, after the processor 106 issues a GC multi-plane cache read command without splitting the command phase and data transfer phase but with bitmaps to the NAND interface controller 108, the NAND interface controller 108 may handle generating multi-plane cache read commands and data transfer commands, and send them to the NAND device without any further involvement (e.g., any subsequent commands) from the processor 106. In some other embodiments, after the initial GC multi-plane cache read command, the processor 106 may also issue a GC data transfer command to start the data transfer phase. In at least one embodiment, the GC data transfer command may also be sent to the NAND interface controller 108 along with the bitmaps of valid data units.

The GC command processor 110 of the NAND interface controller 108 may be configured to translate the GC multi-plane cache read command and bitmaps received from the processor 106 into the command sequences needed to perform the read operation. In particular, the GC command processor 110 may generate page address for each plane, separate command phase and data transfer phase, calculate the column addresses of the valid data unit within a page, and generate the corresponding data transfer commands for valid data units in each interested page. In some embodiments, the GC command processor 110 may be a hardware accelerator implemented as part of the NAND interface controller 108. Embodiments with a GC command processor 110 may greatly reduce the burden of the large number of commands needed on the processor 106. Moreover, the GC command processor 110 may automatically separate command phase and data transfer phase, for example, determining when the R/B signal indicates that data is ready and issuing the data transfer commands.

It should be noted that data stored in the storage array may be protected by Error Encoding Code (ECC). Data stored in different blocks (or pages) may be protected by ECC codewords of different sizes. To calculate the column addresses of valid data units, the NAND interface controller (e.g., the GC command processor 110) may be configured to obtain a data unit (DU) size used for the data transfer commands. The data unit size may be calculated based at least in part on the ECC codeword size. A specified column address for DU i may be calculated as (i−1)*DU size, with "i" being an index of the DU in a page and starting from one (1).

Figure 4:
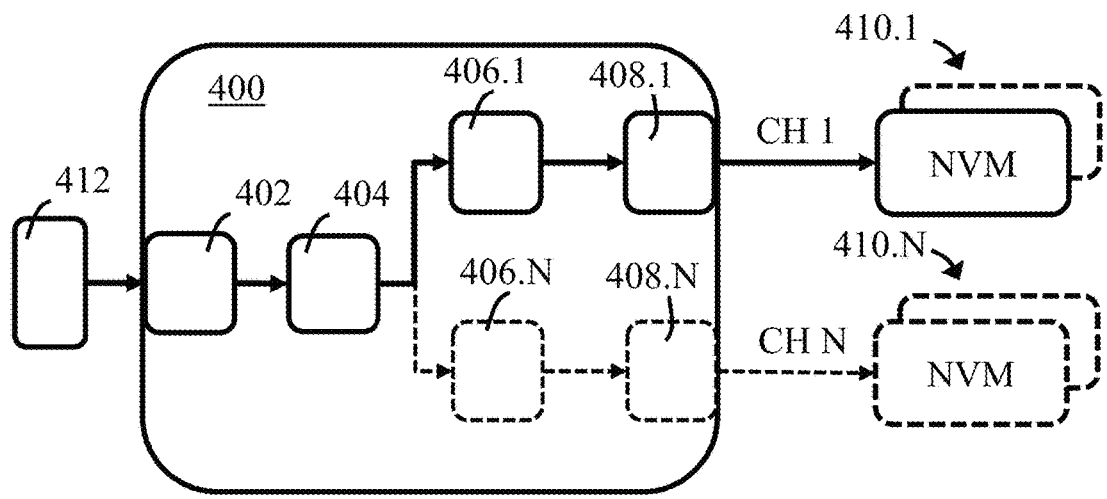
FIG. 4 schematically shows a NAND interface controller in accordance with an embodiment of the present disclosure.

FIG. 4 schematically shows a NAND interface controller 400 in accordance with an embodiment of the present disclosure. The NAND interface controller 400 may comprise a NAND Command Interface 402, a NAND Command Dispatcher 404, a plurality of NAND Command Parser 406.1 through 406.N, and a plurality of NAND Interface Signal Generator 408.1 through 408.N. The NAND interface controller 400 may be an embodiment of the NAND interface controller 108 of FIG. 1. The NAND interface controller 400 may be a multi-channel controller and coupled to the NAND devices 410.1 through 410.N via channels CH 1 through CH N. The GC command processor 110 of FIG. 1 may comprise the plurality of NAND Command Parser 406.1 through 406.N in the embodiment of FIG. 4. Each NAND Command Parser 406.1 through 406.N may be responsible for generating NAND commands for one channel. Each NAND Interface Signal Generator 408.1 through 408.N may be responsible for generating electrical signals (e.g., commands, address enabled signal assert, etc.) for one channel. For example, the NAND Command Parser 406.1 and NAND Interface Signal Generator 408.1 may be for channel one (e.g., CH 1).

The NAND Command Interface 402 may receive the GC multi-plane cache read command and bitmaps from a processor 412, which may be an embodiment of the processor 106 in FIG. 1. The NAND Command Dispatcher 404 may dispatch the received GC multi-plane cache read command and bitmaps to one of the NAND Command Parser 406.1 through 406.N depending on which channel is selected to perform the GC read operation.

As an example, the blocks (e.g., Block i of Plane 0 and Block i of Plane 1) for a GC read operation may be in the NVM 410.1 coupled to channel CH 1, and the GC multi-plane cache read command and bitmaps may be dispatched to the NAND Command Parser 406.1. The NAND Command Parser 406.1 may first parse the GC multi-plane cache read command and bitmaps, and determine that a read operation need to be performed and whether there is at least one valid DU in each plane. If a plane has no valid DU, that plane may be excluded from the read operation.

The NAND Command Parser 406.1 may also obtain column addresses from the bitmaps for pages of data to be read from the storage arrays. In some embodiments, the same page address may be used in the address fields across multiple planes in one batch of multi-plane cache read commands. For example, for a two-plane cache read operation, if page j through page j+5 contain valid data unit in a first plane and page j+1 through page j+6 contain valid data unit in a second plane. Page address for page j may be used in the initial batch of multi-plane read commands for all planes, and the page addresses for page j+1 through page j+6 may be used in subsequent batches of multi-plane cache read commands with the same page addresses in each batch for all planes. Therefore, in these embodiments, 7 rounds of data reading from the storage array and data transferring may be performed in the read operation. The pages that have no valid data units, for example, page j of second plane and page j+6 of the first plane, may be skipped in the data transfer commands. That is, there may be no data transfer commands that carry any column addresses for these planes that do not have any valid data units. It should be noted that, as long as all pages of page j to page j+6 are read from the storage arrays, the page addresses in the batches of multi-plane cache read commands are not necessarily in the order from page j to page j+6. Also, it should be noted that, as used herein, the page address may refer to the page address within a block, and the block addresses for pages in different planes may be different.

In some other embodiments, in the same batch of multi-plane cache read commands, at least one multi-plane cache read command may have a page address different from the page address in another multi-plane cache read command. For example, for a two-plane cache read operation, if page j through page j+5 contain valid data unit in a first plane and page j+1 through page j+6 contain valid data unit in a second plane, the multi-plane read command for the first plane in the initial batch of multi-plane read commands may use page j in its address filed, but because page j of the second plane does not have any valid data unit, the multi-plane read command for the second plane in the initial batch of multi-plane read commands may use page j+1 in its address filed. Therefore, in these embodiments, the multi-plane cache read commands for the first plane may go over all pages of the first plane that contain valid data units, and the multi-plane cache read commands for the second plane may go over all pages of the second plane that contain valid data units. Because the pages that contain valid data units in different planes may not necessarily match, these embodiments may accomplish the read operation in a number of rounds that matches the maximum number of pages that contain valid data units among all planes. For example, if page j through page j+5 contain valid data unit in a first plane and page j+1 through page j+6 contain valid data unit in a second plane, in these embodiments, six rounds of data reading from storage arrays may be used to accomplish the read operation instead of seven rounds of data reading from storage arrays as in those embodiments that the page addresses have to be the same in the same batch of multi-plane cache read commands.

Figure 5A:
FIGS. 5A, 5B, and 5C show the sequence of commands and data transfer in different phases of a read operation in accordance with an embodiment of the present disclosure.

FIG. 5A illustrates an initial batch of multi-plane read commands in the Initial Read Command Phase 302 in accordance with an embodiment of the present disclosure. The Initial Read Command Phase 302 may comprise a plurality of multi-plane read commands 502.1 through 502.M in the initial batch of multi-plane read commands. In one embodiment, each of the multi-plane read commands 502.1 through 502.M–1 may be a multi-plane page read command (e.g., 00h-32h) with an address block (e.g., 5 address fields) sandwiched between 00h and 32h, and the last command 502.M in the batch of multi-plane read commands may be a page read command (00h-30h) with an address block sandwiched between 00h and 30h. The number M may represent the planes involved in a read operation. For example, FIG. 2 shows two planes to be garbage collected in a read operation and M may be two for these two planes. In another example, M may be a different number, for example, 4 in a four-plane cache read operation. As described above, in some embodiments, the address fields of the initial batch of multi-plane read commands may contain the same page address in different planes (e.g., page j in Block i of Plane 0 and page j in Block i of Plane 1 in FIG. 2, assuming page j is the first page of Block i that contains valid data unit in Plane 0 and/or Plane 1). In some other embodiments, at least one of the multi-plane read commands 502.1 through 502.M may contain a page address that is different from another command of 502.1 through 502.M.

Figure 5B:
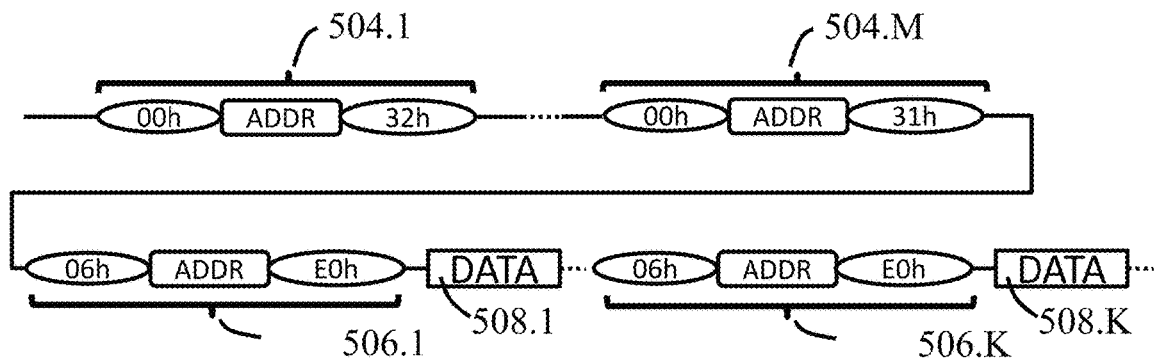

FIG. 5B illustrates one subsequent batch of multi-plane cache read commands followed by a set of data transfer commands in accordance with an embodiment of the present disclosure. The Cache Read Data Transfer Phase 304 may comprise many rounds of data reading from storage array and data transferring. Each round may comprise one subsequent batch of multi-plane cache read commands followed by a set of data transfer commands. FIG. 5B illustrates a plurality of multi-plane cache read commands 504.1 through 504.M in one subsequent batch of multi-plane cache read commands, and followed by many data transfer commands 508.1 through 508.K.

In one embodiment, multi-plane cache read commands 504.1 through 504.M–1 may be page read commands (e.g., 00h-32h) with an address block (e.g., 5 address fields) sandwiched between 00h and 32h, and the last command 504.M in the subsequent batch of multi-plane cache read commands may be a cache read command (00h-31h) with an address block sandwiched between 00h and 31h. The number M may represent the planes involved in a read operation, as in the initial batch of multi-plane read commands. Similar to the initial batch of multi-plane read commands, in some embodiments, all commands 504.1 through 504.M may have the same page address, but in some other embodiments, at least one of the commands 504.1 through 504.M may contain a page address that is different from another command of commands 504.1 through 504.M.

The data transfer commands 506.1 through 506.K may use specified column addresses to selectively identify valid data units of the page of data in the cache registers for transferring from the cache registers (out of the NAND device). In one embodiment, the data transfer commands 506.1 through 506.K may be data output commands with specified column addresses (e.g., 06h-E0h for outputting random data in a page). The specified column address may be put in the address block (e.g., 5 address fields) sandwiched between 06h and E0h. The number K may represent the number of valid data units currently in the cache registers of all planes. For example, the page addresses in the plurality of multi-plane cache read commands 504.1 through 504.M may be page j+1 of FIG. 2 and the column addresses in the data transfer commands 506.1 through 506.K may be the valid data units in page j. These valid data units in page j of Block i in Plane 0 and Plane 1 may have already been read from the storage array into the cache registers and ready to be transferred out of the NAND device. In this example, the number K may be three (3) because there are two valid data units in page j of Plane 0 (e.g., at positions 1 and 3 indicated by a bitmap for valid data units of page j of Block i of Plane 0 of FIG. 2) and one valid data unit in page j of Plane 1 (e.g., at position 2 indicated by a bitmap for valid data units of page j of Block i of Plane 1 of FIG. 2). The specified column addresses in the data transfer commands 506.1 through 506.K may be the column addresses for the two valid data units in page j of Plane 0 and one valid data unit in page j of Plane 1. Each of the data blocks 508.1 through 508.K may represent a valid data unit (e.g., identified by its respective preceding data transfer command 506.1 through 506.K) that is transferred out of the NAND device (sent to the NAND interface controller 108).

It should be noted that FIG. 5B only shows one subsequent batch of multi-plane cache read commands followed by data transfer commands. In general, in one read operation, there may be a plurality of rounds of a subsequent batch of multi-plane cache read commands followed by data transfer commands. For example, to accomplish a read operation of Block i in Plane 0 and Plane 1 of FIG. 2, after one subsequent batch of multi-plane cache read commands to read page j+1 from the storage array into data registers 204 and 210 and data transfer commands to transfer valid data units of page j from the cache registers 202 and 208, a next subsequent batch of multi-plane cache read commands to read page j+2 from the storage array into data registers 204 and 210 and data transfer commands to transfer valid data units of page j+1 from the cache registers 202 and 208 may be sent to the NAND device.

Figure 5C:
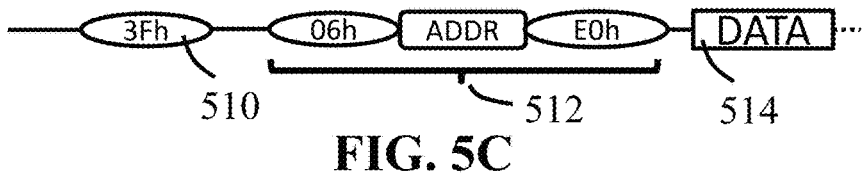

FIG. 5C illustrates a cache read end command 510 followed by a data transfer command 512 in the Cache Read End phase 306 in accordance with an embodiment of the present disclosure. The Cache Read End phase 306 may comprise the cache read end command 510 followed by a last set of data transfer commands, with each of the last set of data transfer commands followed by data transferring (data block 514). In one embodiment, the cache read end command may be a command to stop cache read (e.g., 3Fh). The last set of data transfer commands may use a last set of specified column addresses to selectively identify valid data units of a last page of data in the cache registers. The last page of data in the cache registers may be read from the storage array by a preceding subsequent batch of multi-plane cache read commands. The data transfer command 512 (e.g., a data output command such as 06h-E0h) may be a representative command of the last set of data transfer commands and the data block 514 may represent data in the valid data unit (e.g., identified by the specified column address in the data transfer command 512) being transferred from the NAND device to the NAND interface controller. Each of the last set of data transfer command may be followed by a respective data block being transferred out of the cache registers of the NAND device. The number of data transfer command in the last set of data transfer commands may be equal to the number of valid data units in the last page of data in the cache registers of all planes in the read operation.

Figure 6:
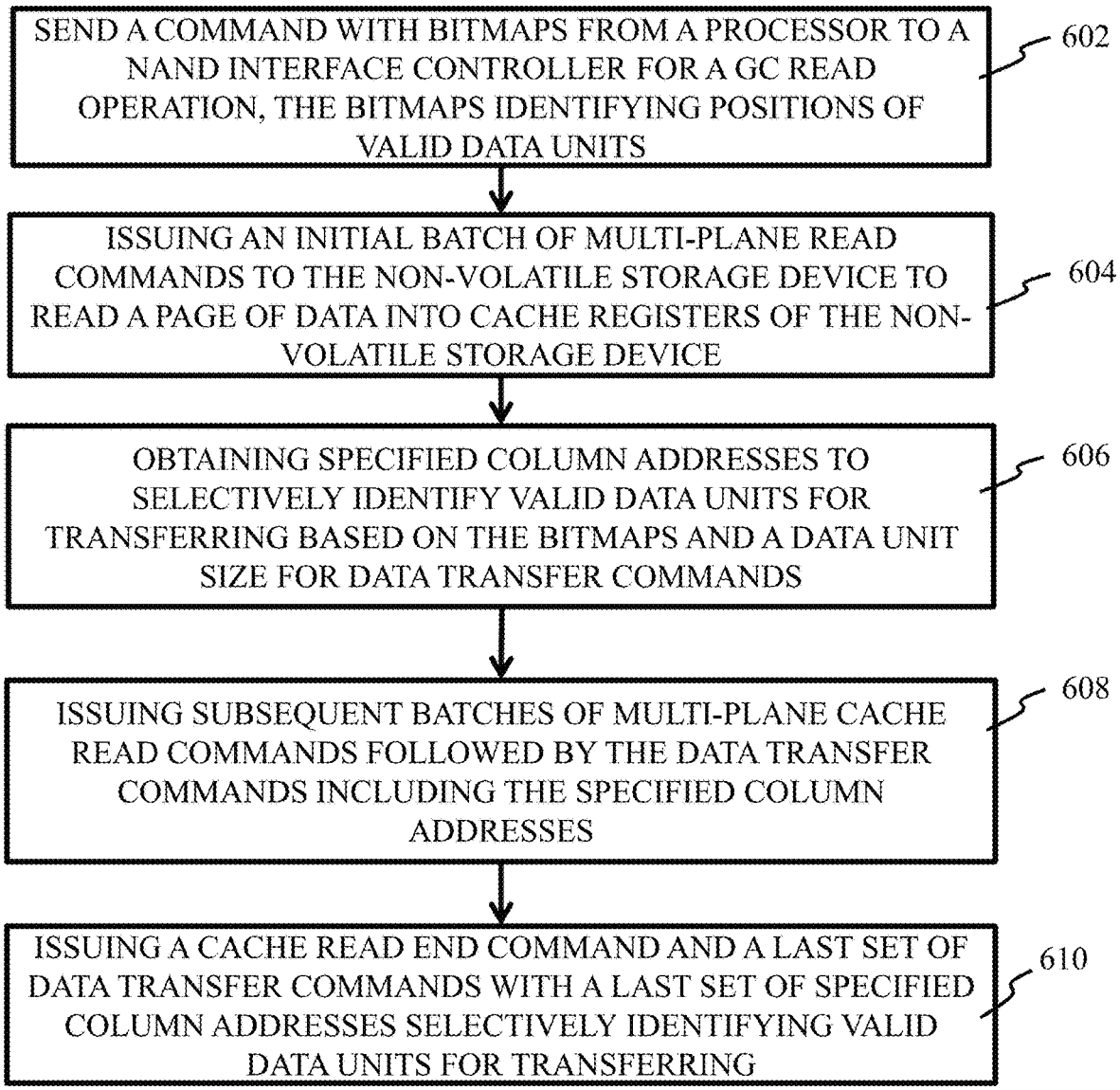
FIG. 6 is a flowchart of a process for performing valid data units retrieval for GC in accordance with an embodiment of the present disclosure.

FIG. 6 is a flowchart of a process 600 for performing valid data units retrieval for GC in accordance with an embodiment of the present disclosure. In block 602, a command with bitmaps may be sent from a processor to a non-volatile storage device interface controller to perform a read operation on a non-volatile storage device. The read operation may be data retrieval for a garbage collection (GC) process on a plurality of blocks. The bitmaps may indicate positions of valid data units in respective pages within the plurality of blocks. The plurality of blocks may be distributed across a plurality of planes of a Logic Unit (LUN) of the non-volatile storage device. For example, the processor 106 may send a command to the NAND interface controller 108 perform a read operation on a LUN of the non-volatile storage device 104, and the command may be sent with bitmaps indicating distribution of the valid data units in respective pages in the blocks of the LUN to be GCed.

In block 604, an initial batch of multi-plane read commands may be issued to the non-volatile storage device. The initial batch of multi-plane read commands may request the non-volatile storage device to read a page of data into cache registers of the non-volatile storage device. For example, the NAND interface controller 108 may issue an initial batch of multi-plane read commands (e.g., commands 502.1 through 502.M) to the non-volatile storage device 104. The initial batch of multi-plane read commands may each contain a page address for a page of data to be read from the storage array of the respective plane. In some embodiments, the page address may be the same for all planes, and in some other embodiments, the page addresses may include different addresses for different planes.

In block 606, specified column addresses to selectively identify valid data units for transferring may be obtained based on the bitmaps and a data unit size for data transfer commands. For example, data stored in different blocks (or pages) may be protected by ECC codewords of different sizes. To calculate the column addresses of valid data units, the NAND interface controller (e.g., the GC command processor 110) may be configured to obtain a data unit size used for the data transfer commands. The data unit (DU) size may be calculated, at least in part, based on the ECC codeword size. And the column addresses for valid data units may be obtained based on the data unit size and the bitmaps.

In block 608, subsequent batches of multi-plane cache read commands followed by data transfer commands may be issued to the non-volatile storage device. The data transfer commands may include the specified column addresses to selectively identify valid data units of the page of data in the cache registers for transferring from the non-volatile storage device. For example, after the initial batch of multi-plane read commands, the NAND interface controller 108 may issue subsequent batches of multi-plane cache read commands to the non-volatile storage device 104. Each subsequent batches of multi-plane cache read commands (e.g., commands 504.1 through 504.M) may be followed by a respective set of data transfer commands (e.g., commands 506.1 through 506.K). Each data transfer command may identify one data valid unit to be transferred from the non-volatile storage device (e.g., data blocks 508.1 through 508.K). Therefore, data units not identified as valid data units may be skipped for data transferring. In some embodiments, the processor 106 is not involved in the data transferring process. In some other embodiments, the processor 106 may send a GC multi-plane data transfer command to the NAND interface controller 108 to start the data transferring process.

In block 610, a cache read end command followed by a last set of data transfer commands may be issued to the non-volatile storage device. The last set of data transfer commands may include a last set of specified column addresses to selectively identify valid data units of a last page of data in the cache registers for transferring. For example, the NAND interface controller 108 may issue a command to stop cache read (e.g., 3Fh) and the last set of data transfer commands (e.g., a plurality of commands 512) to the non-volatile storage device 104. Each of the last set of data transfer commands may identify one data valid unit to be transferred from the non-volatile storage device (e.g., data block 514).

Because it is hard to have the same valid data unit pattern for the same page cross all planes, GC data retrieval can't efficiently use conventional multi-plane read or normal single plane read, which will cause a low throughput to retrieve valid data units because the large read overhead of the conventional read. Moreover, conventional multi-plane cache read or cache read will cause all data units of the pages be sent out via NAND device 10 and invalid data unit will be dropped in ECC unit or in storage at the storage controller (e.g., SRAM/DRAM). Transferring invalid data unit on NAND IO will affect other read or write operations because NAND IO are shared between multiple NAND devices. In contrast, embodiments according to the present disclosure can achieve high read throughput of multi-plane cache read without wasting NAND IO bandwidth.

In an exemplary embodiment, there is provided a method that may comprise sending a command from a processor to a non-volatile storage device interface controller to perform a read operation on a non-volatile storage device for a garbage collection (GC) process on a plurality of blocks. The command may be transmitted with bitmaps indicating positions of valid data units in respective pages within the plurality of blocks and the plurality of blocks may be distributed across a plurality of planes of the non-volatile storage device. The method may further comprise issuing an initial batch of multi-plane read commands to the non-volatile storage device, obtaining specified column addresses to selectively identify valid data units for transferring based on the bitmaps and a data unit size for data transfer commands, issuing subsequent batches of multi-plane cache read commands followed by the data transfer commands to the non-volatile storage device, and issuing a cache read end command followed by a last set of data transfer commands to the non-volatile storage device. The initial batch of multi-plane read commands may request the non-volatile storage device read a page of data from each of the plurality of planes into cache registers of the non-volatile storage device. The data transfer commands may include the specified column addresses to selectively identify valid data units of the page of data in the cache registers for transferring from the non-volatile storage device. And the last set of data transfer commands may include a last set of specified column addresses to selectively identify valid data units of a last page of data in the cache registers for transferring.

In one embodiment, the method may further comprise determining, based on the bitmaps, which plane of the non-volatile storage device does not have any valid data unit and excluding the plane that does not have at least one valid data unit from the read operation.

In one embodiment, the method may further comprise sending a multi-plane data transfer command from the processor to the non-volatile storage device interface controller to start data transfer.

In one embodiment, the non-volatile storage device interface controller may comprise a GC command processor, and the method may further comprise: parsing the bitmaps to generate the specified column addresses and the last set of specified column addresses for the valid data units within each of the plurality of blocks.

In one embodiment, the GC command processor may comprise a plurality of command parsers each responsible for a different channel, the method may further comprise: inside the non-volatile storage device interface controller, dispatching the command and the bitmaps received from the processor to a command parser based on which channel is selected for the GC process.

In one embodiment, the GC command processor may be configured to automatically separate a command phase and a data transfer phase of the read operation.

In one embodiment, obtaining specified column addresses to selectively identify valid data units for transferring may further comprise: obtaining the data unit (DU) size used for the data transfer commands; and calculating a specified column address for DU i as $(i-1)*DU$ size, with "i" being an index of the DU in a page starting from one (1).

In one embodiment, page addresses in the initial batch of multi-plane read commands and subsequent batches of multi-plane cache read commands are a same page address for each batch, respectively.

In one embodiment, page addresses in at least one batch of the initial batch of multi-plane read commands and subsequent batches of multi-plane cache read commands include two different page addresses for two different planes.

In one embodiment, data units in the bitmaps indicated as invalid are skipped for data transferring from the non-volatile storage device.

In another exemplary embodiment, there is provided a non-volatile storage system. The non-volatile storage system may comprise a storage controller including a processor and a non-volatile storage interface controller, and a non-volatile storage device coupled to the storage controller. The processor may be configured to send a command to the non-volatile storage device interface controller to perform a read operation on the non-volatile storage device for a garbage collection (GC) process on a plurality of blocks. The command may be transmitted with bitmaps indicating positions of valid data units in respective pages within the plurality of blocks. The plurality of blocks may be distributed across a plurality of planes of the non-volatile storage device. The non-volatile storage interface controller may be configured to: issue an initial batch of multi-plane read commands to the non-volatile storage device, obtain specified column addresses to selectively identify valid data units for transferring based on the bitmaps and a data unit size for data transfer commands, issue subsequent batches of multi-plane cache read commands followed by the data transfer commands to the non-volatile storage device, and issue a cache read end command followed by a last set of data transfer commands to the non-volatile storage device. The initial batch of multi-plane read commands may request the non-volatile storage device read a page of data from each of the plurality of planes into cache registers of the non-volatile storage device. The data transfer commands may include the specified column addresses to selectively identify valid data units of the page of data in the cache registers for transferring from the non-volatile storage device. The last set of data transfer commands may include a last set of specified column addresses to selectively identify valid data units of a last page of data in the cache registers for transferring.

In one embodiment, the non-volatile storage interface controller may be further configured to determine, based on the bitmaps, which plane of the non-volatile storage device does not have any valid data unit and exclude the plane that does not have at least one valid data unit from the read operation.

In one embodiment, the processor may be further configured to send a multi-plane data transfer command to the non-volatile storage device interface controller to start data transfer.

In one embodiment, the non-volatile storage device interface controller may comprise a GC command processor, and the GC command processor may be configured to parse the bitmaps to generate the specified column addresses and the last set of specified column addresses for the valid data units within each of the plurality of blocks.

In one embodiment, the GC command processor may comprise a plurality of command parsers each responsible for a different channel and a command dispatcher may be configured to dispatch the command and the bitmaps received from the processor to a command parser based on which channel is selected for the GC process.

In one embodiment, the GC command processor may be configured to automatically separate a command phase and a data transfer phase of the read operation.

In one embodiment, to obtain the specified column addresses to selectively identify valid data units for transferring, the GC command processor may be further configured to: obtain the data unit (DU) size used for the data transfer commands, and calculate a specified column address for DU i as (i−1)*DU size, with "i" being an index of the DU in a page starting from one (1).

In one embodiment, page addresses in the initial batch of multi-plane read commands and subsequent batches of multi-plane cache read commands may be a same page address for each batch, respectively.

In one embodiment, page addresses in at least one batch of the initial batch of multi-plane read commands and subsequent batches of multi-plane cache read commands may include two different page addresses for two different planes.

In one embodiment, data units in the bitmaps indicated as invalid may be skipped for data transferring from the non-volatile storage device.

Any of the disclosed methods and operations may be implemented as computer-executable instructions (e.g., software code for the operations described herein) stored on one or more computer-readable storage media (e.g., non-transitory computer-readable media, such as one or more optical media discs, volatile memory components (such as DRAM or SRAM), or nonvolatile memory components (such as hard drives)) and executed on a device controller (e.g., firmware executed by ASIC). Any of the computer-executable instructions for implementing the disclosed techniques as well as any data created and used during implementation of the disclosed embodiments can be stored on one or more computer-readable media (e.g., non-transitory computer-readable media).

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method, comprising:
    sending a command from a processor to a non-volatile storage device interface controller to perform a read operation on a non-volatile storage device for a garbage collection (GC) process on a plurality of blocks, the command being transmitted with bitmaps indicating positions of valid data units in respective pages within the plurality of blocks, the plurality of blocks being distributed across a plurality of planes of the non-volatile storage device;
    issuing an initial batch of multi-plane read commands to the non-volatile storage device, the initial batch of multi-plane read commands requesting the non-volatile storage device read a page of data from each of the plurality of planes into cache registers of the non-volatile storage device;
    obtaining specified column addresses to selectively identify valid data units for transferring based on the bitmaps and a data unit size for data transfer commands;
    issuing subsequent batches of multi-plane cache read commands followed by data transfer commands to the non-volatile storage device, the data transfer commands including the specified column addresses to selectively identify valid data units of the page of data in the cache registers for transferring from the non-volatile storage device; and
    issuing a cache read end command followed by a last set of data transfer commands to the non-volatile storage device, the last set of data transfer commands including a last set of specified column addresses to selectively identify valid data units of a last page of data in the cache registers for transferring.

2. The method of claim 1, further comprising determining, based on the bitmaps, which plane of the non-volatile storage device does not have any valid data unit and excluding the plane that does not have at least one valid data unit from the read operation.

3. The method of claim 1, further comprising:
    sending a multi-plane data transfer command from the processor to the non-volatile storage device interface controller to start data transfer.

4. The method of claim 1, wherein the non-volatile storage device interface controller comprises a GC command processor, and the method further comprises: parsing the bitmaps to generate the specified column addresses and the last set of specified column addresses for the valid data units within each of the plurality of blocks.

5. The method of claim 4, wherein the GC command processor comprises a plurality of command parsers each responsible for a different channel, the method further comprises: inside the non-volatile storage device interface controller, dispatching the command and the bitmaps received from the processor to a command parser based on which channel is selected for the GC process.

6. The method of claim 4, wherein the GC command processor is configured to automatically separate a command phase and a data transfer phase of the read operation.

7. The method of claim 4, wherein obtaining specified column addresses to selectively identify valid data units for transferring comprises:
    obtaining the data unit (DU) size used for the data transfer commands; and
    calculating a specified column address for DU i as (i−1)*DU size, with "i" being an index of the DU in a page starting from one (1).

8. The method of claim 1, wherein page addresses in the initial batch of multi-plane read commands and subsequent batches of multi-plane cache read commands are a same page address for each batch, respectively.

9. The method of claim 1, wherein page addresses in at least one batch of the initial batch of multi-plane read commands and subsequent batches of multi-plane cache read commands include two different page addresses for two different planes.

10. The method of claim 1, wherein data units in the bitmaps indicated as invalid are skipped for data transferring from the non-volatile storage device.

11. A non-volatile storage system, comprising:
a storage controller including a processor and a non-volatile storage interface controller; and
a non-volatile storage device coupled to the storage controller, wherein
the processor is configured to send a command to the non-volatile storage device interface controller to perform a read operation on the non-volatile storage device for a garbage collection (GC) process on a plurality of blocks, the command being transmitted with bitmaps indicating positions of valid data units in respective pages within the plurality of blocks, the plurality of blocks being distributed across a plurality of planes of the non-volatile storage device;
wherein the non-volatile storage interface controller is configured to:
issue an initial batch of multi-plane read commands to the non-volatile storage device, the initial batch of multi-plane read commands requesting the non-volatile storage device read a page of data from each of the plurality of planes into cache registers of the non-volatile storage device;
obtain specified column addresses to selectively identify valid data units for transferring based on the bitmaps and a data unit size for data transfer commands
issue subsequent batches of multi-plane cache read commands followed by data transfer commands to the non-volatile storage device, the data transfer commands including specified column addresses to selectively identify valid data units of the page of data in the cache registers for transferring from the non-volatile storage device; and
issue a cache read end command followed by a last set of data transfer commands to the non-volatile storage device, the last set of commands including a last set of specified column addresses to selectively identify valid data units of a last page of data in the cache registers for transferring.

12. The non-volatile storage system of claim 11, wherein the non-volatile storage interface controller is further configured to determine, based on the bitmaps, which plane of the non-volatile storage device does not have any valid data unit and exclude the plane that does not have at least one valid data unit from the read operation.

13. The non-volatile storage system of claim 11, wherein the processor is further configured to send a multi-plane data transfer command to the non-volatile storage device interface controller to start data transfer.

14. The non-volatile storage system of claim 11, wherein the non-volatile storage device interface controller comprises a GC command processor, and the GC command processor is configured to parse the bitmaps to generate the specified column addresses and the last set of specified column addresses for the valid data units within each of the plurality of blocks.

15. The non-volatile storage system of claim 14, wherein the GC command processor comprises a plurality of command parsers each responsible for a different channel and a command dispatcher configured to dispatch the command and the bitmaps received from the processor to a command parser based on which channel is selected for the GC process.

16. The non-volatile storage system of claim 14, wherein the GC command processor is configured to automatically separate a command phase and a data transfer phase of the read operation.

17. The non-volatile storage system of claim 14, wherein, to obtain the specified column addresses to selectively identify valid data units for transferring, the GC command processor is further configured to:
obtain the data unit (DU) size used for the data transfer commands; and
calculate a specified column address for DU i as (i−1)*DU size, with "i" being an index of the DU in a page starting from one (1).

18. The non-volatile storage system of claim 11, wherein page addresses in the initial batch of multi-plane read commands and subsequent batches of multi-plane cache read commands are a same page address for each batch, respectively.

19. The non-volatile storage system of claim 11, wherein page addresses in at least one batch of the initial batch of multi-plane read commands and subsequent batches of multi-plane cache read commands include two different page addresses for two different planes.

20. The non-volatile storage system of claim 11, wherein data units in the bitmaps indicated as invalid are skipped for data transferring from the non-volatile storage device.

* * * * *